United States Patent
Stucke, Jr. et al.

(10) Patent No.: US 8,038,538 B2
(45) Date of Patent: Oct. 18, 2011

(54) ELECTRONIC DEVICE FOR ENHANCING AN INTERACTIVE EXPERIENCE WITH A TANGIBLE MEDIUM OF EXPRESSION

(75) Inventors: Donald W. Stucke, Jr., East Aurora, NY (US); Bradley Clark, Orchard Park, NY (US); Robert W. Salmon, Buffalo, NY (US); Brian Aiken, East Aurora, NY (US); Scott H. McIlvain, Holland, NY (US)

(73) Assignee: Mattel, Inc., El Segundo, CA (US)

( * ) Notice: Subject to any disclaimer, the term of this patent is extended or adjusted under 35 U.S.C. 154(b) by 716 days.

(21) Appl. No.: 11/569,215

(22) PCT Filed: Jun. 6, 2005

(86) PCT No.: PCT/US2005/019608
§ 371 (c)(1),
(2), (4) Date: Aug. 18, 2008

(87) PCT Pub. No.: WO2005/118097
PCT Pub. Date: Dec. 15, 2005

(65) Prior Publication Data
US 2008/0300062 A1      Dec. 4, 2008

Related U.S. Application Data

(60) Provisional application No. 60/577,387, filed on Jun. 4, 2004.

(51) Int. Cl.
G06F 17/00 (2006.01)
(52) U.S. Cl. .......................................................... 463/43
(58) Field of Classification Search .................... 463/43, 463/44; 434/81, 85, 155; 446/175, 484
See application file for complete search history.

(56) References Cited

U.S. PATENT DOCUMENTS

| | | | |
|---|---|---|---|
| 2,528,611 A | 11/1950 | Saffady |
| 3,080,611 A | 3/1963 | Conrath |
| 3,824,706 A | 7/1974 | Scopa et al. |
| 3,918,029 A | 11/1975 | Lemelson |
| 4,337,375 A | 6/1982 | Freeman |

(Continued)

OTHER PUBLICATIONS

Supplemental European Search Report issued May 7, 2010.

(Continued)

*Primary Examiner* — Ronald Laneau
(74) *Attorney, Agent, or Firm* — Panitch Schwarze Belisario & Nadel LLP

(57) ABSTRACT

An electronic device for enhancing an interactive experience with a tangible medium of expression is disclosed. The device is operable with a any of a plurality of preprogrammed, removable memory modules, at least one memory module having content relating to the tangible medium. The electronic device has a processor coupled to each of a user input device, a user output device, and a memory address space comprising a preprogrammed, non-removable electronic memory. A memory interface is configured to increase the memory address space accessible to the processor when any combination of the memory modules is coupled to the interface. The processor is configured to cause the output device to produce an output signal relating to the tangible medium based on the content of the memory address space when any combination of the plurality of removable memory modules including the at least one memory module is coupled to the interface.

32 Claims, 14 Drawing Sheets

U.S. PATENT DOCUMENTS

| | | |
|---|---|---|
| 4,358,278 A | 11/1982 | Goldfarb |
| 4,392,053 A | 7/1983 | Bockholt |
| 4,457,719 A | 7/1984 | Dittakavi et al. |
| 4,465,349 A | 8/1984 | Rinn et al. |
| 4,466,801 A | 8/1984 | Dittakavi et al. |
| 4,505,682 A | 3/1985 | Thompson |
| 4,549,867 A | 10/1985 | Dittakavi |
| 4,570,250 A | 2/1986 | Gabritsos et al. |
| 4,602,152 A | 7/1986 | Dittakavi |
| 4,604,065 A | 8/1986 | Frazer et al. |
| 4,627,819 A | 12/1986 | Burrows |
| 4,851,840 A | 7/1989 | McAulay |
| 4,869,532 A | 9/1989 | Abe et al. |
| 4,874,936 A | 10/1989 | Chandler et al. |
| 4,884,974 A | 12/1989 | DeSmet |
| 4,889,365 A | 12/1989 | Chouinard |
| 4,889,367 A | 12/1989 | Miller |
| 4,891,011 A | 1/1990 | Cook |
| 4,896,029 A | 1/1990 | Chandler et al. |
| 4,901,359 A | 2/1990 | Bruder |
| 4,902,880 A | 2/1990 | Garczynski et al. |
| 4,921,278 A | 5/1990 | Shiang et al. |
| 4,924,078 A | 5/1990 | Sant'Anselmo et al. |
| 4,939,354 A | 7/1990 | Priddy et al. |
| 4,963,718 A | 10/1990 | Hoshizaki et al. |
| 4,971,410 A | 11/1990 | Wike, Jr. et al. |
| 5,059,126 A | 10/1991 | Kimball |
| 5,095,197 A | 3/1992 | Chadima, Jr. et al. |
| 5,128,528 A | 7/1992 | Heninger |
| 5,138,140 A | 8/1992 | Siemiatkowski et al. |
| 5,144,120 A | 9/1992 | Krichever et al. |
| 5,160,171 A | 11/1992 | Gregory et al. |
| 5,180,904 A | 1/1993 | Shepard et al. |
| 5,187,353 A | 2/1993 | Metlitsky et al. |
| 5,190,285 A | 3/1993 | Levy et al. |
| 5,258,605 A | 11/1993 | Metlitsky et al. |
| 5,263,865 A | 11/1993 | Zipf |
| 5,288,986 A | 2/1994 | Pine et al. |
| 5,291,009 A | 3/1994 | Roustaei |
| 5,298,731 A | 3/1994 | Ett |
| 5,314,336 A | 5/1994 | Diamond et al. |
| 5,329,108 A | 7/1994 | Lamoure |
| 5,331,176 A | 7/1994 | Sant'Anselmo et al. |
| 5,340,971 A | 8/1994 | Rockstein et al. |
| 5,393,967 A | 2/1995 | Rice et al. |
| 5,399,846 A | 3/1995 | Pavlidis et al. |
| 5,401,944 A | 3/1995 | Bravman et al. |
| 5,415,553 A | 5/1995 | Szmidla |
| 5,416,312 A | 5/1995 | Lamoure |
| 5,430,284 A | 7/1995 | Numazaki |
| 5,442,188 A | 8/1995 | Brimbal et al. |
| 5,444,230 A | 8/1995 | Baldwin et al. |
| 5,446,267 A | 8/1995 | Stanzani et al. |
| 5,448,049 A | 9/1995 | Shafer et al. |
| 5,468,949 A | 11/1995 | Swartz et al. |
| 5,473,151 A | 12/1995 | Priddy et al. |
| 5,477,045 A | 12/1995 | Priddy et al. |
| 5,480,306 A | 1/1996 | Liu |
| 5,483,051 A | 1/1996 | Marchi |
| 5,514,860 A | 5/1996 | Berson |
| 5,525,789 A | 6/1996 | Rockstein et al. |
| 5,532,467 A | 7/1996 | Roustaei |
| 5,550,363 A | 8/1996 | Obata |
| 5,557,095 A | 9/1996 | Clark et al. |
| 5,575,659 A | 11/1996 | King et al. |
| 5,611,694 A | 3/1997 | Bromley |
| 5,612,524 A | 3/1997 | Sant'Anselmo et al. |
| 5,633,489 A | 5/1997 | Dvorkis et al. |
| 5,675,136 A | 10/1997 | Keinath et al. |
| 5,677,522 A | 10/1997 | Rice et al. |
| 5,689,823 A | 11/1997 | Phillips |
| 5,695,345 A | 12/1997 | Weiner et al. |
| 5,717,221 A | 2/1998 | Li et al. |
| 5,723,853 A | 3/1998 | Longacre, Jr. et al. |
| 5,736,723 A | 4/1998 | Clarke et al. |
| 5,756,981 A | 5/1998 | Roustaei et al. |
| 5,763,864 A | 6/1998 | O'Hagan et al. |
| 5,767,501 A | 6/1998 | Schmidt et al. |
| 5,773,807 A | 6/1998 | Barkan et al. |
| 5,794,540 A | 8/1998 | Dombrowski et al. |
| 5,796,089 A | 8/1998 | Marom |
| 5,796,091 A | 8/1998 | Schmidt et al. |
| 5,818,026 A | 10/1998 | Melling et al. |
| 5,818,027 A | 10/1998 | Paratore |
| 5,864,127 A | 1/1999 | Jackson et al. |
| 5,886,337 A | 3/1999 | Rockstein et al. |
| 5,892,846 A | 4/1999 | Davis |
| 5,894,119 A | 4/1999 | Tognazzini |
| 5,897,669 A | 4/1999 | Matsui |
| 5,898,166 A | 4/1999 | Fukuda et al. |
| 5,900,617 A | 5/1999 | Dvorkis et al. |
| 5,923,022 A | 7/1999 | Penn et al. |
| 5,942,743 A | 8/1999 | Schmidt et al. |
| 5,945,656 A | 8/1999 | Lemelson et al. |
| 5,959,281 A | 9/1999 | Domiteaux |
| 5,971,279 A | 10/1999 | Raistrick et al. |
| 5,984,190 A | 11/1999 | Nevill |
| 5,984,366 A | 11/1999 | Priddy |
| 5,988,506 A | 11/1999 | Schaham et al. |
| 6,015,090 A | 1/2000 | Swartz et al. |
| 6,065,676 A | 5/2000 | Ring et al. |
| 6,085,981 A | 7/2000 | Knowles et al. |
| 6,098,877 A | 8/2000 | Barkan et al. |
| 6,102,505 A | 8/2000 | McIntyre et al. |
| 6,123,261 A | 9/2000 | Roustaei |
| 6,182,898 B1 | 2/2001 | Schmidt et al. |
| 6,184,534 B1 | 2/2001 | Stephany et al. |
| 6,223,988 B1 | 5/2001 | Batterman et al. |
| 6,227,450 B1 | 5/2001 | Blake et al. |
| 6,229,964 B1 | 5/2001 | Bell |
| 6,247,648 B1 | 6/2001 | Katz et al. |
| 6,299,067 B1 | 10/2001 | Schmidt et al. |
| 6,325,420 B1 | 12/2001 | Zhang et al. |
| 6,328,214 B1 | 12/2001 | Akel et al. |
| 6,330,427 B1 | 12/2001 | Tabachnik |
| 6,340,114 B1 | 1/2002 | Correa et al. |
| 6,354,630 B1 | 3/2002 | Zhang et al. |
| 6,357,659 B1 | 3/2002 | Kelly et al. |
| 6,360,949 B1 | 3/2002 | Shepard et al. |
| 6,384,744 B1 | 5/2002 | Philyaw et al. |
| 6,412,695 B1 | 7/2002 | Reber et al. |
| 6,427,917 B2 | 8/2002 | Knowles et al. |
| 6,427,920 B1 | 8/2002 | Bloomberg et al. |
| 6,427,922 B1 | 8/2002 | Marchand |
| 6,439,465 B1 | 8/2002 | Bloomberg |
| 6,441,921 B1 | 8/2002 | Soscia |
| 6,460,766 B1 | 10/2002 | Olschafskie et al. |
| 6,460,768 B2 | 10/2002 | Ring et al. |
| 6,474,888 B1 | 11/2002 | Lapstun et al. |
| 6,484,944 B1 | 11/2002 | Manine et al. |
| 6,502,756 B1 | 1/2003 | Fahraeus |
| 6,523,314 B1 | 2/2003 | LaLonde et al. |
| 6,533,168 B1 | 3/2003 | Ching |
| 6,536,670 B1 | 3/2003 | Postman et al. |
| 6,540,141 B1 | 4/2003 | Dougherty et al. |
| 6,549,230 B2 | 4/2003 | Tosaya |
| 6,549,239 B1 | 4/2003 | Tao |
| 6,550,685 B1 | 4/2003 | Kindberg |
| 6,556,628 B1 | 4/2003 | Poulton et al. |
| 6,556,690 B1 | 4/2003 | Nelson |
| 6,585,158 B2 | 7/2003 | Norskog |
| 6,590,837 B1 | 7/2003 | Kaplan |
| 6,592,039 B1 | 7/2003 | Smith et al. |
| 6,594,406 B1 | 7/2003 | Hecht |
| 6,604,682 B2 | 8/2003 | Wakamiya et al. |
| 6,607,134 B1 | 8/2003 | Bard |
| 6,608,618 B2 | 8/2003 | Wood et al. |
| 6,616,038 B1 | 9/2003 | Olschafskie et al. |
| 6,622,276 B2 | 9/2003 | Nagasaki et al. |
| 6,631,845 B2 | 10/2003 | Barkan |
| 6,633,223 B1 | 10/2003 | Schenker et al. |
| 6,634,558 B1 | 10/2003 | Patel et al. |
| 6,641,053 B1 | 11/2003 | Breidenbach et al. |
| 6,651,886 B2 | 11/2003 | Gurevich et al. |
| 6,685,095 B2 | 2/2004 | Roustaei et al. |
| 6,688,527 B2 | 2/2004 | Knowles et al. |
| 6,692,031 B2 | 2/2004 | McGrew |

| | | |
|---|---|---|
| 6,708,894 B2 | 3/2004 | Mazaika |
| 6,729,543 B1 | 5/2004 | Arons et al. |
| 6,732,929 B2 | 5/2004 | Good et al. |
| 6,732,930 B2 | 5/2004 | Massieu et al. |
| 6,732,932 B2 | 5/2004 | Schuessler et al. |
| 6,732,935 B2 | 5/2004 | Vinogradov et al. |
| 6,739,511 B2 | 5/2004 | Tsikos et al. |
| 6,749,120 B2 | 6/2004 | Hung et al. |
| 6,752,317 B2 | 6/2004 | Dymetman et al. |
| 6,758,398 B1 | 7/2004 | Philyaw et al. |
| 6,764,008 B2 | 7/2004 | Tsikos et al. |
| 6,766,954 B2 | 7/2004 | Barkan et al. |
| 6,783,069 B1 | 8/2004 | Hecht et al. |
| 6,808,118 B2 | 10/2004 | Field |
| 6,808,330 B1 | 10/2004 | Lapstun et al. |
| 6,814,289 B2 | 11/2004 | Cummings et al. |
| 6,817,525 B2 | 11/2004 | Piva et al. |
| 6,820,808 B2 | 11/2004 | Mehler |
| 6,827,277 B2 | 12/2004 | Bloomberg et al. |
| 6,830,189 B2 | 12/2004 | Tsikos et al. |
| 6,837,432 B2 | 1/2005 | Tsikos et al. |
| 6,857,570 B2 | 2/2005 | Tsikos et al. |
| 6,863,216 B2 | 3/2005 | Tsikos et al. |
| 6,865,367 B2 | 3/2005 | Kim et al. |
| 6,869,022 B2 | 3/2005 | Corby, Jr. |
| 6,877,096 B1 | 4/2005 | Chung et al. |
| 6,904,154 B2 | 6/2005 | Azima et al. |
| 6,905,391 B2 | 6/2005 | Soto et al. |
| 6,913,202 B2 | 7/2005 | Tsikos et al. |
| 6,915,103 B2 | 7/2005 | Blume |
| 6,935,563 B2 | 8/2005 | Okada et al. |
| 6,953,151 B2 | 10/2005 | Tsikos et al. |
| 6,953,152 B2 | 10/2005 | Tsikos et al. |
| 6,957,775 B2 | 10/2005 | Tsikos et al. |
| 6,957,923 B2 | 10/2005 | Lapstun et al. |
| 6,959,866 B2 | 11/2005 | Takahashi et al. |
| 6,969,001 B2 | 11/2005 | Tsikos et al. |
| 6,971,575 B2 | 12/2005 | Tsikos et al. |
| 6,971,576 B2 | 12/2005 | Tsikos et al. |
| 6,971,577 B2 | 12/2005 | Tsikos et al. |
| 6,978,935 B2 | 12/2005 | Tsikos et al. |
| 6,978,936 B2 | 12/2005 | Tsikos et al. |
| 6,985,607 B2 | 1/2006 | Alasia et al. |
| 6,988,661 B2 | 1/2006 | Tsikos et al. |
| 6,991,165 B2 | 1/2006 | Tsikos et al. |
| 7,007,852 B2 | 3/2006 | Silverbrook et al. |
| 7,025,271 B2 | 4/2006 | Dvorkis et al. |
| 7,040,538 B2 | 5/2006 | Patel et al. |
| 7,603,505 B2 * | 10/2009 | Stucke et al. ............... 710/301 |
| 7,831,933 B2 * | 11/2010 | Marggraff et al. ............ 715/863 |
| 7,853,193 B2 * | 12/2010 | Marggraff ..................... 434/317 |
| 2002/0023957 A1 | 2/2002 | Michaelis et al. |
| 2002/0076683 A1 | 6/2002 | Chen |
| 2002/0084327 A1 | 7/2002 | Ehrhart et al. |
| 2002/0084335 A1 | 7/2002 | Ericson |
| 2002/0158137 A1 | 10/2002 | Grey et al. |
| 2002/0192009 A1 | 12/2002 | Tuli |
| 2002/0197589 A1 | 12/2002 | Wood et al. |
| 2003/0052178 A1 | 3/2003 | Zeller et al. |
| 2003/0052179 A1 | 3/2003 | Pinson |
| 2003/0089777 A1 | 5/2003 | Rajasekharan et al. |
| 2003/0116630 A1 | 6/2003 | Carey et al. |
| 2003/0129572 A1 | 7/2003 | Shuler et al. |
| 2003/0133164 A1 | 7/2003 | Tsai |
| 2003/0146282 A1 | 8/2003 | Tsikos et al. |
| 2003/0150916 A1 | 8/2003 | Tsikos et al. |
| 2003/0150917 A1 | 8/2003 | Tsikos et al. |
| 2003/0189098 A1 | 10/2003 | Tsikos et al. |
| 2003/0218069 A1 | 11/2003 | Meier et al. |
| 2003/0218070 A1 | 11/2003 | Tsikos et al. |
| 2004/0043365 A1 | 3/2004 | Kelley et al. |
| 2004/0089727 A1 | 5/2004 | Baharav et al. |
| 2004/0094627 A1 | 5/2004 | Parker et al. |
| 2004/0104890 A1 | 6/2004 | Caldwell et al. |
| 2004/0125413 A1 | 7/2004 | Cordery |
| 2004/0135053 A1 | 7/2004 | Henson |
| 2004/0182928 A1 | 9/2004 | Ehrhart et al. |
| 2004/0195333 A1 | 10/2004 | Silverbrook et al. |
| 2004/0200904 A1 | 10/2004 | Pinson |
| 2004/0229195 A1 | 11/2004 | Marggraff et al. |
| 2005/0053906 A1 | 3/2005 | Kim et al. |
| 2005/0061140 A1 | 3/2005 | Vallery |
| 2005/0064372 A1 | 3/2005 | Shuler et al. |
| 2005/0085301 A1 | 4/2005 | Hammond et al. |
| 2005/0106538 A1 | 5/2005 | Freeman et al. |
| 2005/0120778 A1 | 6/2005 | Von Herzen et al. |
| 2005/0137004 A1 | 6/2005 | Wood et al. |
| 2005/0142521 A1 | 6/2005 | Chen |

OTHER PUBLICATIONS

Suarez G: "Sony Playstation 2". Internet citation. Nov. 15, 2000, XP002285037; Retrieved from the Internet: URL: http://www.thedigitalbits.com/reviews/ps2/sonyps2*.html> [retrieved from the Internet on Jun. 16, 2004].

International Search Report issued in connection with PCT/US05/19608 dated Sep. 19, 2006, 2 pages.

Sonix Technologies Co.—SNR016 16-bit Mask ROM—9 pages—Oct. 21, 2005.

Texas Instruments Incorporated—TMS 5220 Voice Synthesis Processor Data Manual—32 pages—Jun. 1981.

Sonix Technologies Co.—SNC710 16-bit Voice Engine—16 pages—Apr. 3, 2003.

Australian Examiner's Report dated Sep. 20, 2010 in AU 2005250028.

* cited by examiner

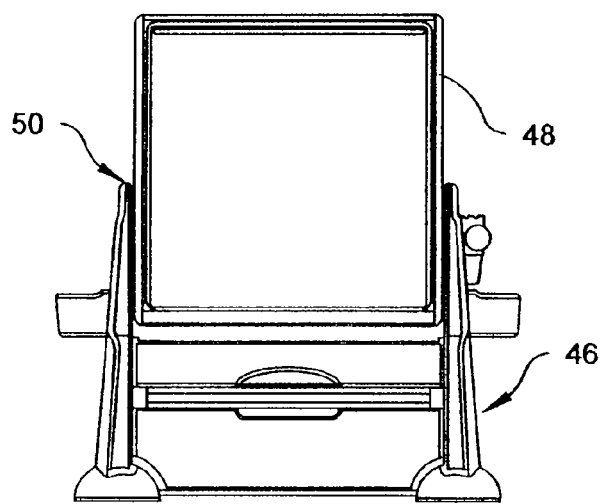
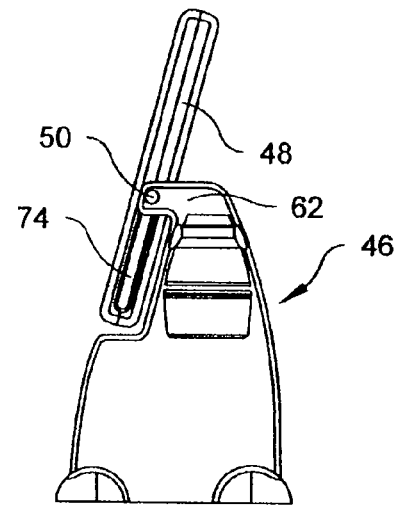
Fig. 7  Fig. 8
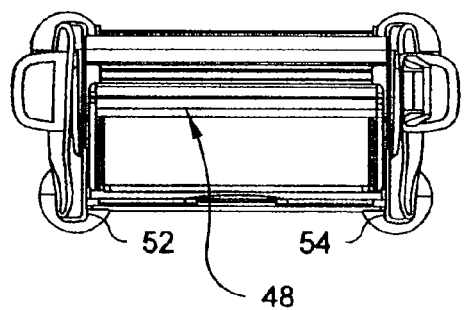
Fig. 9

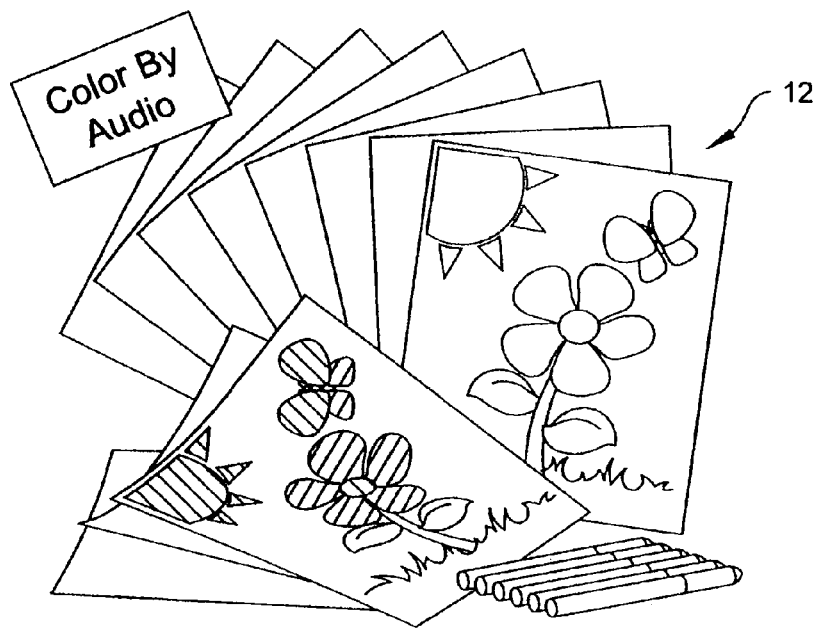
Fig. 12
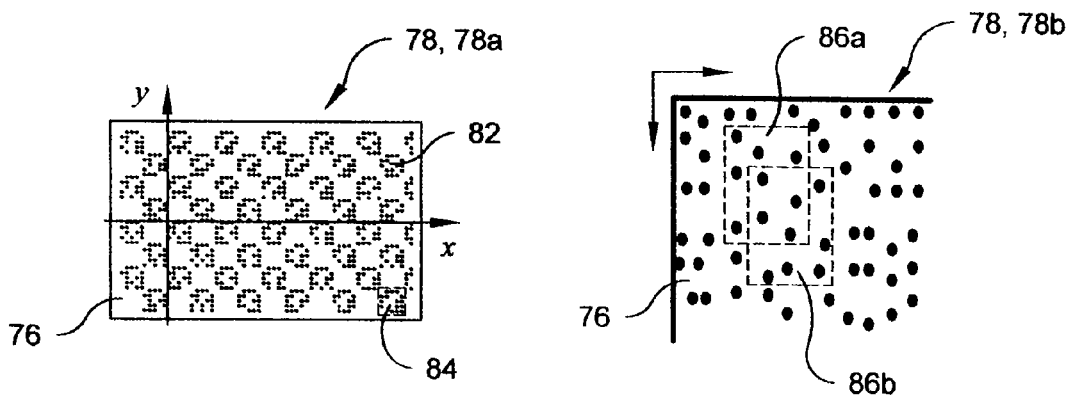
Fig. 13      Fig. 14

ELECTRONIC DEVICE FOR ENHANCING AN INTERACTIVE EXPERIENCE WITH A TANGIBLE MEDIUM OF EXPRESSION

CROSS-REFERENCE TO RELATED APPLICATIONS

This application is a Section 371 of International Application No. PCT/US05/19608 (International Publication Number WO 2005/118097 A2) filed Jun. 6, 2005, which claims priority to U.S. Provisional Patent Application No. 60/577, 387, filed Jun. 4, 2004 entitled "Electronic Book System With An Optical Indicia Sensor" which is incorporated herein by reference, and claims the earlier filing dates of the provisional application.

BACKGROUND OF THE INVENTION

The present invention relates to electronic device for enhancing an interactive experience with a tangible medium of expression. More particularly, the present invention relates to an electronic device operable with any of a plurality of preprogrammed, removable memory modules, at least one removable memory module having content relating to the tangible medium of expression.

A wide variety of electronic devices for enhancing an interactive experience with a tangible medium of expression are memory limited. Typically, to keep the cost of base unit electronics affordable, the non-removable memory contained there in is minimal. As it is desirable to provide a wide variety of tangible media for use with a base unit, supplemental memory containing content specifically relating to the medium is provided and the base unit is configured to removably receive the supplemental memory in a single removable memory slot. Providing an single expansion slot to supplement the non-removable memory creates several problems. One of the problems is the possible loss or misplacement of the supplemental memory. Another problem is the possibility of having in the removable memory slot a supplemental memory that is not associated with the tangible medium being used. These problems create frustration for the user and may make the base unit essentially inoperative for the intended interactive experience of the moment.

Accordingly, there is a need in the art for device that is operable with any of a plurality of preprogrammed, removable memory modules, one or more of which have content relating to the tangible medium of expression.

BRIEF SUMMARY OF THE INVENTION

Briefly stated, one embodiment of the present invention is directed to an electronic device for enhancing an interactive experience with a tangible medium of expression. The device is operable with any of a plurality of preprogrammed, removable memory modules. At least one removable memory module has content relating to the tangible medium of expression. The electronic device comprises a processor and a memory interface. The processor is coupled to each of a memory address space having memory address space content, a user input device, and a user output device. The memory address space comprises a preprogrammed, non-removable electronic memory. The memory interface is coupled to the processor. The memory interface is configured to increase the memory address space accessible to the processor when any combination of the removable memory modules is coupled to the memory interface. The processor is configured to cause the user output device to produce an output signal relating to the tangible medium of expression based on the memory address space content when any combination of the plurality of removable memory modules including the at least one removable memory module is coupled to the memory interface.

Another embodiment of the present invention is directed to an interactive electronic device operable with any of a plurality of preprogrammed, removable read only memory modules to increase read only memory of the device. The device comprises a processor operatively coupled to each of a memory address space comprising a preprogrammed non-removable read only memory, a user input device, and a user output device. A memory interface is coupled to the processor. The memory interface comprises a plurality of memory module connectors, each configured and exposed sufficiently to removably receive any of the plurality of read only memory modules. A bus is configured to physically and electrically simultaneously couple all of the memory module connectors with the processor and to physically and electrically simultaneously couple the processor with any combination of the plurality of removable memory modules arranged in any order in any of the plurality of memory connectors so as to increase the memory address space accessible by the processor whereby all removable memory modules received in the memory module connectors are addressed simultaneously by the processor through the bus and the plurality of memory module connectors.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

In the drawings:

FIG. 7 is a front elevation view of the device of FIG. 1;

FIG. 8 is a is a side elevation view of the device of FIG. 1;

FIG. 9 is a top plan view of the device of FIG. 1;

FIG. 12 is a preferred embodiment of the tangible medium directed to coloring for use with the device of FIG. 1;

FIG. 13 is a preferred embodiment of the identification code for the tangible medium of FIG. 1;

FIG. 14 is another preferred embodiment of the identification code for the tangible medium of FIG. 1;

DETAILED DESCRIPTION OF THE INVENTION

Figure 1:
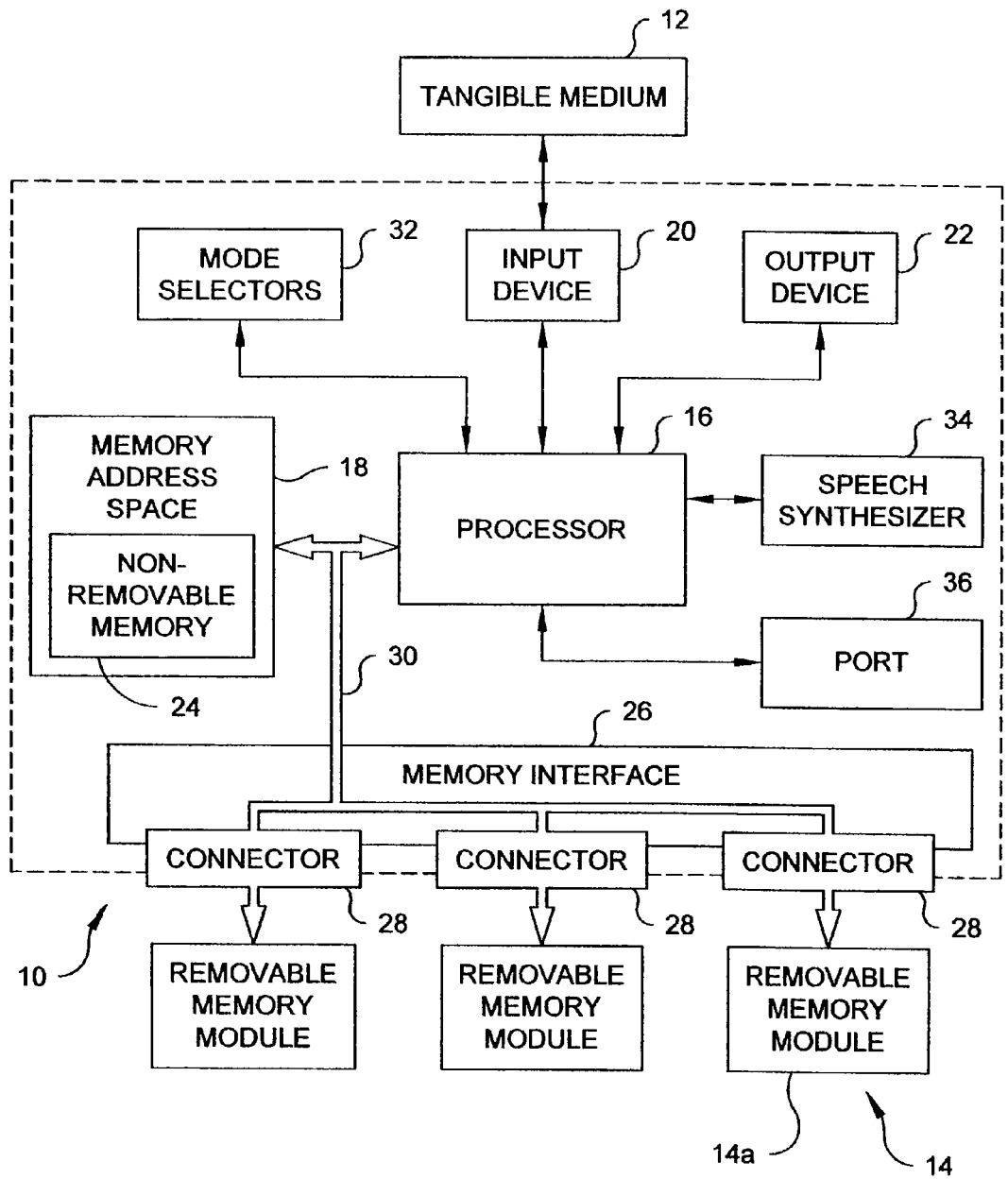
FIG. 1 is a schematic block diagram of a first preferred embodiment of the electronic device in accordance with the present invention.

Certain terminology is used in the following description for convenience only and is not limiting. The words "right," "left," "lower" and "upper" designate directions in the drawings to which reference is made. The words "inwardly" and "outwardly" refer to directions toward and away from, respectively, the geometric center of electronic learning device, and designated parts thereof. The terminology includes the words noted above, derivatives thereof and words of similar import.

Referring to the drawings in detail, where like numerals indicate like elements throughout, there is shown in FIGS. 1-13 a first preferred embodiment of the electronic device, generally designated 10, and hereinafter referred to as the "electronic device" 10 in accordance with the present invention. The electronic device 10 is for enhancing a user's interactive experience with a tangible medium of expression hereinafter referred to as the "tangible medium" 12 as further described below. The electronic device 10 is operable with any of a plurality of preprogrammed, removable memory modules 14, at least one removable memory module 14a having content relating to the tangible medium 12. The removable memory modules 14 may be read only memory, flash memory, and, in general, any non-volatile memory.

Referring to FIG. 1, the electronic device 10 comprises a processor 16 coupled to each of a memory address space 18 having memory address space content, a user input device 20, and a user output device 22. The memory address space 18 comprises a preprogrammed, non-removable memory 24.

The non-removable memory may be read only memory, flash memory, and in general any non-volatile memory.

A memory interface 26 is coupled to the processor 16. The memory interface 26 is configured to increase the memory address space 18 accessible to the processor 16 when any combination of the removable memory modules 14 is coupled to the memory interface 26. The memory interface 26 has a plurality of memory module connectors 28. Each memory module connector 28 is configured and exposable sufficiently to removably receive any of the plurality of memory modules 14.

The memory interface 26 has a bus 30. The preferred embodiment of the bus 30 is configured to physically and electrically simultaneously couple all of the memory module connectors 28 with the processor 16 and to physically and electrically simultaneously couple the processor 16 with any combination of the plurality of removable memory modules 14 arranged in any order in any of the plurality of memory connectors 28 so as to increase the memory address space 18 accessible by the processor 16 whereby all removable memory modules 14 received in the memory module connectors 28 are addressed simultaneously by the processor 16 through the bus 30 and the plurality of memory module connectors 28.

Preferably, the bus 30 is configured to couple all of the memory module connectors directly with the processor 28 and to couple the processor directly with any combination of the plurality of removable memory modules 14 whereby all removable memory modules 14 received in the memory module connectors 28 are addressed directly by the processor 14 through the bus 30 and the plurality of memory module connectors 28. In alternative bus configurations that could possibly be used with the electronic device 10, the bus 30 may comprise switching circuitry for remapping the addresses of the plurality of memory module connectors 28 such as the switching logic unit disclosed in U.S. Pat. No. 5,802,544 (Combs et al.). The bus 30 may also be configured in accordance with any bus architecture providing the connectivity set forth above, including for example the well known universal serial bus architecture.

The processor 16 is configured to cause the user output device 22 to produce an output signal relating to the tangible medium 12 based on the memory address space content when any combination of the plurality of removable memory modules 14, including the at least one removable memory module 14a, is coupled to the memory interface 26.

Software assignable mode selectors 32 in electrical communication with the processor 16 may be provided to allow the user to interrupt and/or change the mode of operation of the electronic device 10. A speech synthesizer 34 and a port 36, each in electrical communication with the processor 16 also may be provided. The port 36 may be configured to operatively couple the processor 16 to an auxiliary electronic device (not shown). The port 36 may be configured as a universal serial bus port, an s-video port together with a standard stereo audio port, or a custom designed port. Possible auxiliary electronic devices may include, but are not limited to, special effects lighting, a visual display, or an audio input device.

Figure 10:
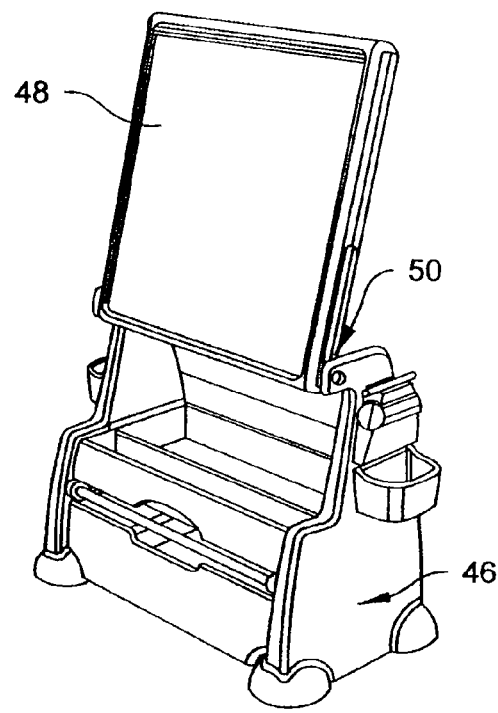
FIG. 10 is a front perspective view of the device of FIG. 1 showing the platform in an elevated position.

Referring to FIGS. 9 and 10, a housing 38 having an accessible enclosure 40 is provided. The processor 16, the non-removable memory 24, the user output device, and the memory interface 26 are in the housing. The plurality of memory module connectors 28 are in the accessible enclosure 40. The accessible enclosure 40 may contain a source of power 42, such as batteries, for the electronic device 10. Alternatively, the source of power 42 may be in a separate enclosure (not shown) in the housing 40. The enclosure 40 may be accessible by pivoting a hinged cover 44 or by removing a access plate (not shown) that is attached to the housing by a friction fit or by fasteners as is typical of the battery compartments of common hand held devices.

Referring to FIGS. 5-12, the electronic device 10 may further comprise a base 46, a platform 48, and a coupling 50. The housing 38 containing the processor 16 and the related electronics is removably couplable to the base 46 by any of a wide variety of well known methods including but not limited to clips, hooks, Velcro® and the like.

The base 46 comprises a first support 52 and a second support 54 spaced from the first support 52 and connected to the first support by cross-members 56. Preferably, the first and second supports 52, 54 are a molded polymeric material and the cross-members are metal tubing. Alternatively, the first and second supports 52, 56 and the cross-members 56 may be wood or metal or a polymeric material in their entirety or any combination of these materials. One or more drawers (or storage bins) 58 may be provided between the first and second supports 52, 56. A back 60 may also be provided between the first and second supports 52, 56. The upper portion of the first and second supports 52, 54 forms a mount 62 for receiving the coupling 50. A stop 64 extends between the first and second supports 52, 54 proximal to the mount 62.

The platform 48 is configured to support the tangible medium 12 and has a tangible medium retainer 66 configured to releasably retain the tangible medium 12 adjacent the platform 48. The tangible medium retainer 66 may be clips, clamps or other fasteners actuatable independently or in unison by a retainer mechanism 68 connected to the platform 48. The platform 48 may have a substantially flat planar surface 70 configured to support the tangible medium 12. The substantially flat planar surface 70 may be reusable or ferromagnetic or both. For example, the substantially flat planar surface may be a white board with a ferromagnetic backing that is suitable for use with dry erase markers. The tangible medium 12 may be a roll 72 of consumable or reusable paper attached to one side of the platform 48 and may be extendable across the platform 48 to form a working (or drawing) surface removably secured to the platform 48 by the tangible medium retainer 66. A slot 74 extends along a portion of two opposed sides of the platform 48 is for receiving the coupling 50.

Figure 11:
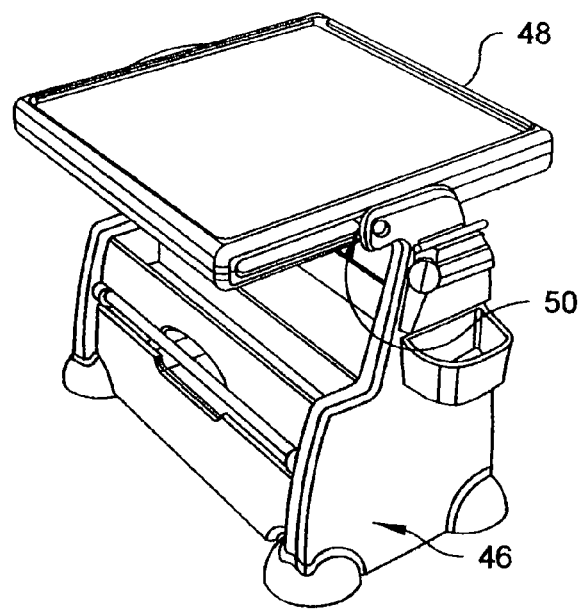
FIG. 11 is a front perspective view of the device of FIG. 1 showing the platform in a horizontal position.

The coupling 50 is configured to rotatably and slidably couple the platform 48 to the base 46. The coupling 50 is further configured to releasably retain the platform 48 in a plurality of positions including an angled position relative to a vertical (FIG. 5), the angled position at a plurality of vertical heights (FIG. 10), and a generally horizontal position (FIG. 11). The coupling 50 may be a rod supported by the mounts 62 in the first and second supports 52, 54 and extending through the slots 74 in the opposed sides of the platform adjacent the mounts 62. Adjustable fasteners (not shown) attached to each end of the rod may releasable retain the platform in the any of the positions discussed above by a friction between the mounts 62 and the platform 48. Alternatively, the coupling may comprise any well known locking mechanism for securing the platform in the desired position.

Referring to FIGS. 12-16, the tangible medium 12 has a surface 76 with an identification code 78 (FIGS. 13-14). The at least one removable memory 14a has stored therein content relating to the identification code 78. Preferably, the user input device 20 comprises an identification code detector 80 (FIG. 4), the user output device 22 comprises an audio signal generator, and the processor 16 is configured to cause the audio signal generator to produce an audio signal relating to the tangible medium 12 in response to detection of the identification code 78 by the identification code detector 80.

The identification code 78 may be based on any well known, machine readable encoding scheme capable of uniquely identifying a plurality of tangible media, each of which has at least one distinguishing feature. For example, the well known Universal Product Code symbol appearing on commercial products uniquely identifies each product. Preferably, the identification code 78 is a substantially invisible optically detectable code and the identification code detector 80 is an electro-optic device 80a configured to detect the substantially invisible optically detectable code. The substantially invisible code may be an index based code or a position based code.

Figure 4:
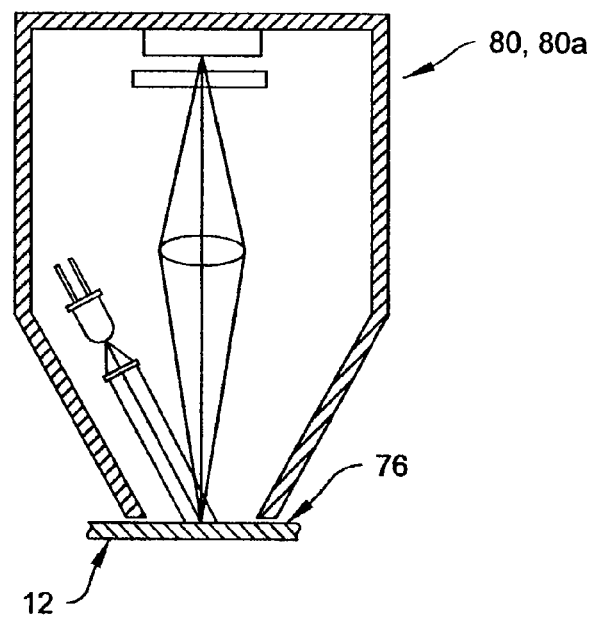
FIG. 4 is a schematic of a preferred embodiment of the user input device of FIG. 1.
Figure 5:
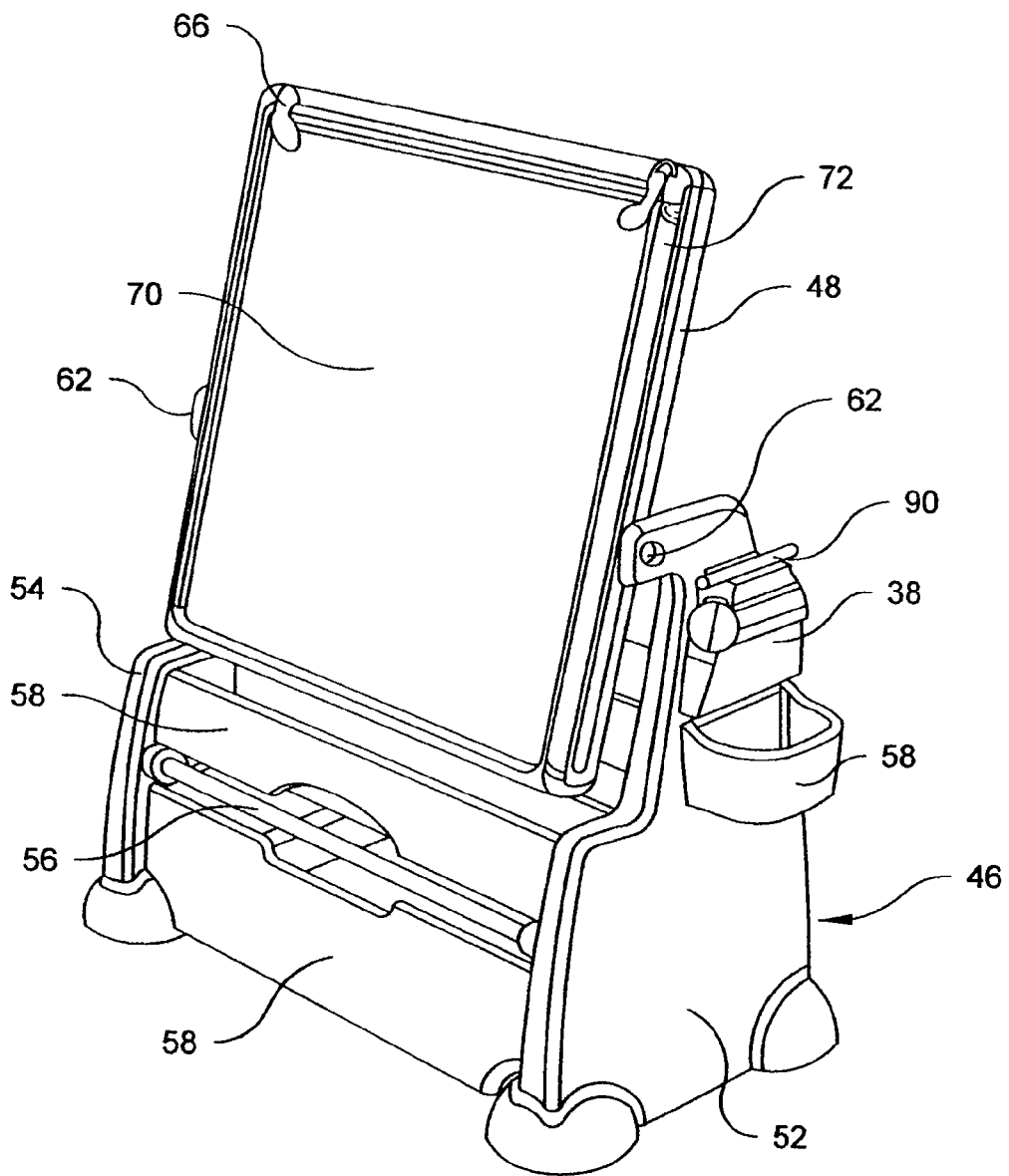
FIG. 5 is a front perspective view of the device of FIG. 1.
Figure 6:
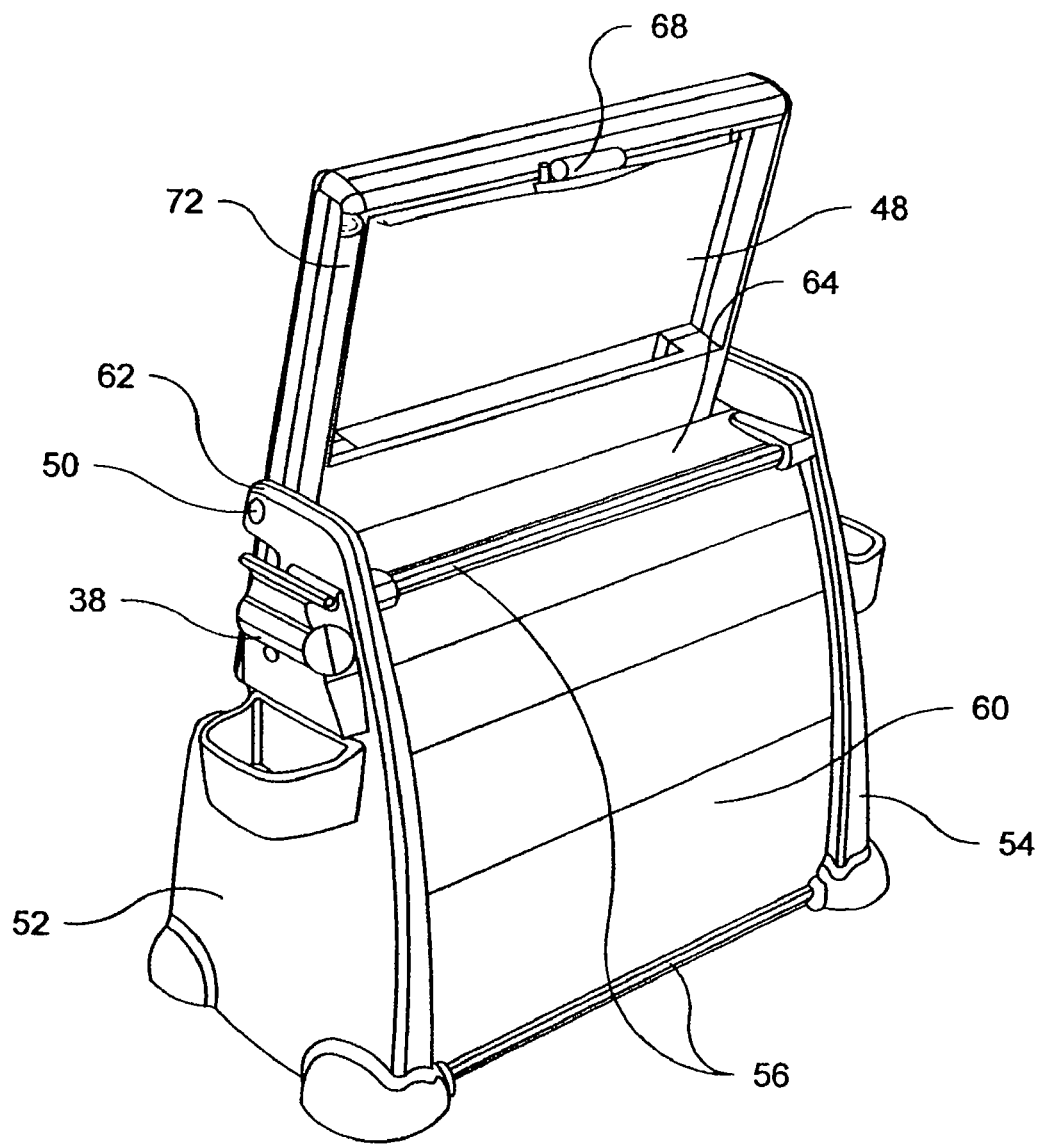
FIG. 6 is a rear perspective view of the device of FIG. 1.

An example of an index based encoding scheme referred to hereafter as the "Lamoure encoding" 78a is disclosed in FIG. 4 of U.S. Pat. No. 5,329,108, incorporated herein by reference, and is reproduced, in pertinent part, in FIG. 13 of this application. The Lamoure encoding 78a comprises a plurality of indexes 82. Each index comprises a group of dots placed on a surface within an area of the surface. The indexes as a whole form a location frame 84 covering an object (not shown) in the area and are superimposed thereon. The indexes 82 identify either the location frame 84 or the object within the location frame 84.

Figure 3:
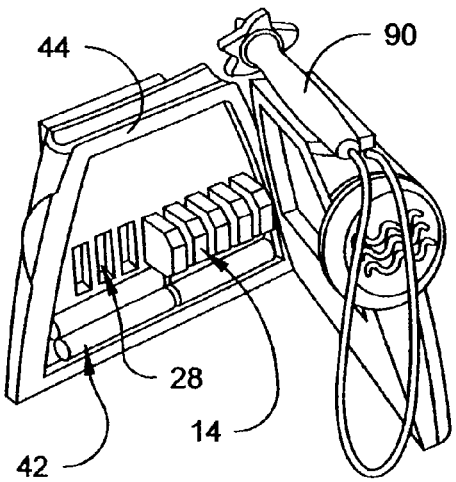
FIG. 3 is a front perspective view of the housing of FIG. 3 with the accessible enclosure open.

An example of a position based code hereafter referred to as the "Fåhraeus encoding" 78b is disclosed in FIG. 3 of U.S. Pat. No. 6,502,756, incorporated herein by reference, and is reproduced, in pertinent part, in FIG. 14 of this application. The Fåhraeus encoding 78b consists of symbols systematically arranged across a sheet so as to make the surface appearance patterned. The pattern is arranged in such a manner that absolute coordinates for a point on the surface are coded by the symbols on a partial surface of the sheet. A first and a second partial surface 86a, 86b are indicated by dashed lines in FIG. 14. The part of the pattern found on the first partial surface 86a codes the x-y coordinates for a first point and the part of the pattern found on the second partial surface 86b codes the x-y coordinates for a second point. Based on the knowledge of the coordinates of the first partial surface or the second partial surface, by table look-up, the processor 16 may determine the identify of any object collocated at the subject point.

The electro-optic device 80a (FIG. 4) configured to detect the substantially invisible optically detectable code may be any well known electro-optical sensor capable of acquiring and digitizing for subsequent processing an image of the substantially invisible codes. Preferably, the electro-optic device 80a is substantially the same as the optical-reading device disclosed in FIG. 6 of U.S. Patent Application Publication No. US 2003/0133164 A1 and reproduced, in pertinent part, in FIG. 4 of this application. The electro-optic device 80a is operatively coupled to the processor 16 and is configured to detect the plurality of substantially invisible codes 78a, 78b and to send to the processor 70 a signal representative of the detected code for decoding. Alternatively, the electro-optic device 80a may additionally comprise the electronics necessary for decoding the codes and send to the processor 16 a signal representative of the decoding.

Figure 15:
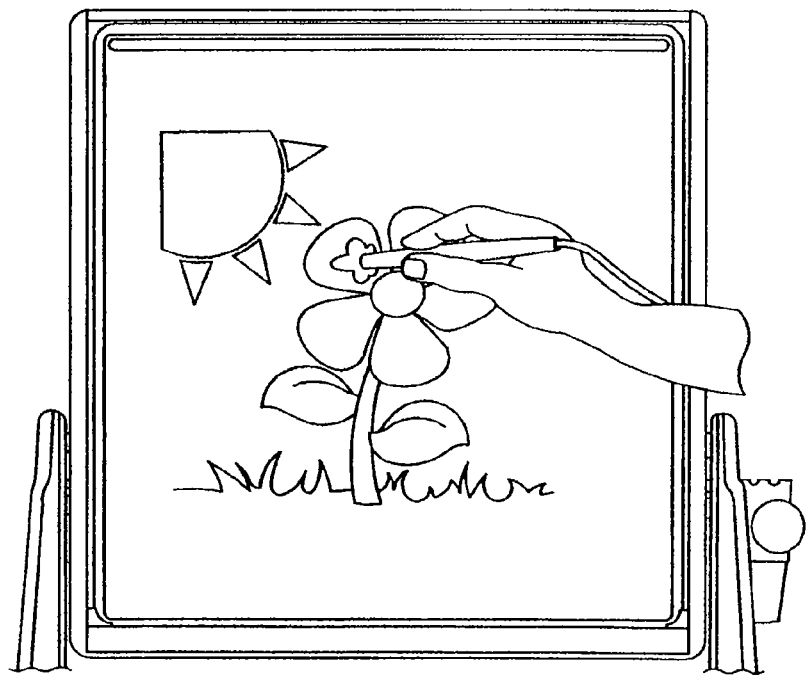
FIG. 15 is a front elevation view of a portion of a tangible medium of FIG. 12 attached to the platform of the device of FIG. 1, wherein the identification code of the petal is being detected.
Figure 16:
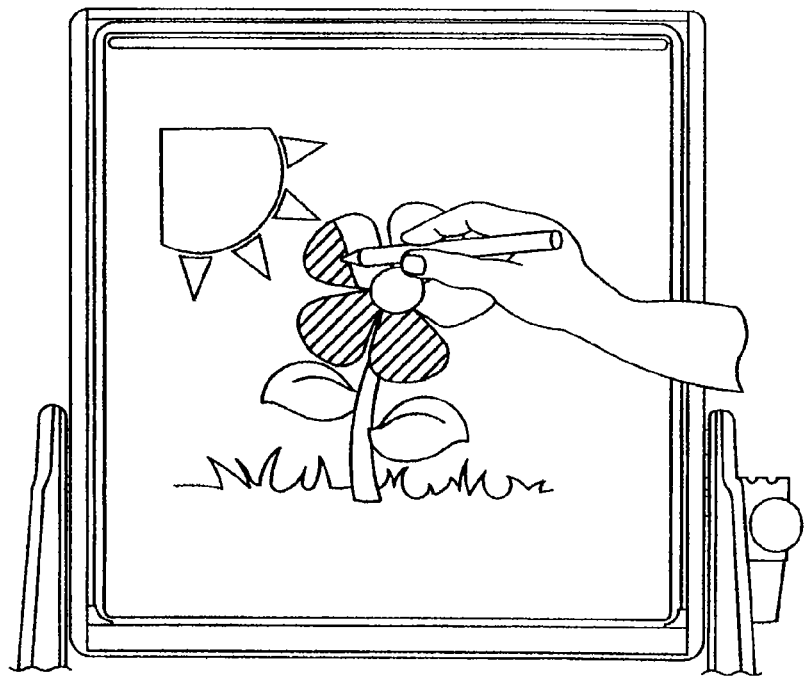
FIG. 16 is a front elevation view of a portion of a tangible medium of FIG. 12 attached to the platform of the device of FIG. 1, wherein the petal is being colored in accordance with a suggestion caused by the detection of the identification code of the petal.

Referring to FIGS. 12, 15 and 16, as set forth above, the processor 16 is configured to cause the audio signal generator to produce an audio signal relating to the tangible medium 12 in response to detection of the identification code 78 by the identification code detector 80. For example, if the identification code for the petal of a flower is detected (FIG. 15), the audio signal may be a suggestion to choose the color pink or purple to color the flower. In response to the suggestion, the user may select the purple marker 88 (FIGS. 12, 16) for use in coloring the petals. Other prompts or suggestions preprogrammed and stored in memory may be output depending on the nature of the tangible medium 12 and the desired interactive experience.

Figure 17:
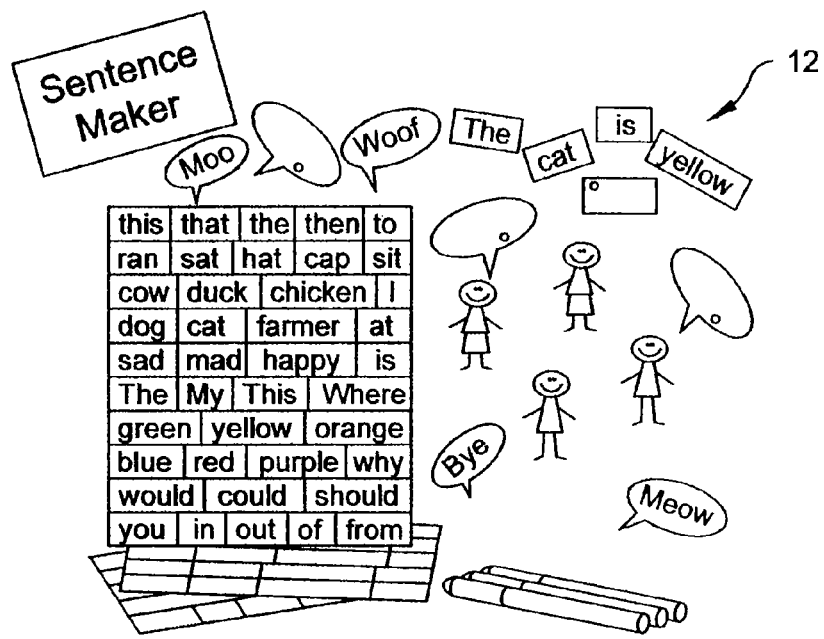
FIG. 17 is a preferred embodiment of the tangible medium directed to sentence making for use with the device of FIG. 1.
Figure 18:
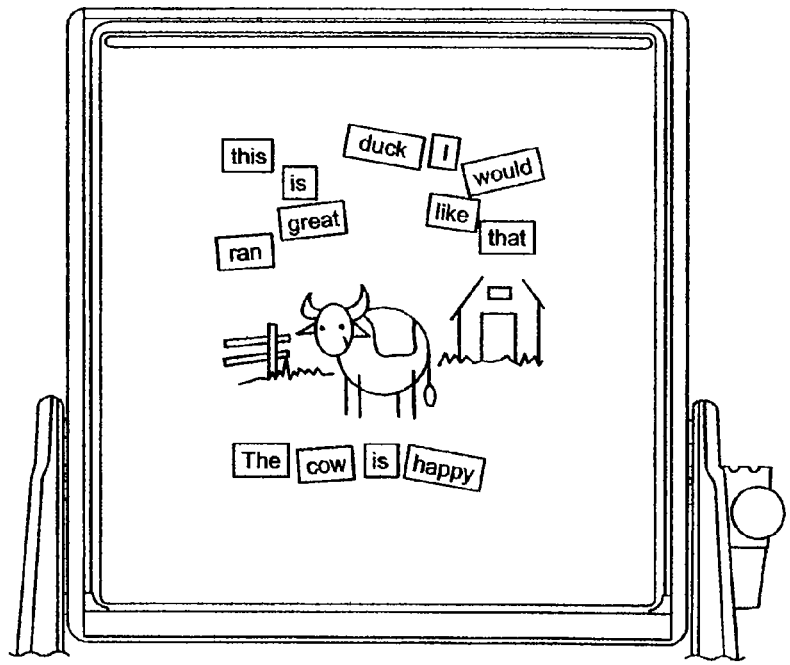
FIG. 18 is a front elevation view of elements of the tangible medium of FIG. 17 being used to create sentences.
Figure 19:
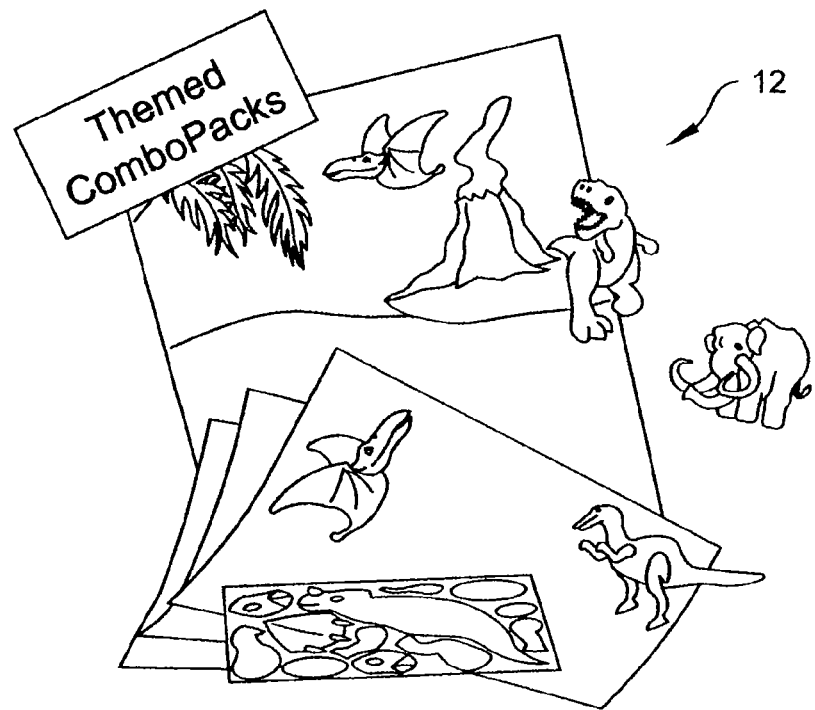
FIG. 19 is a preferred embodiment of the tangible medium directed to a dinosaur theme for use with the device of FIG. 1.
Figure 20:
FIG. 20 is a preferred embodiment of the tangible medium directed to zoo animals for use with the device of FIG. 1.
Figure 21:
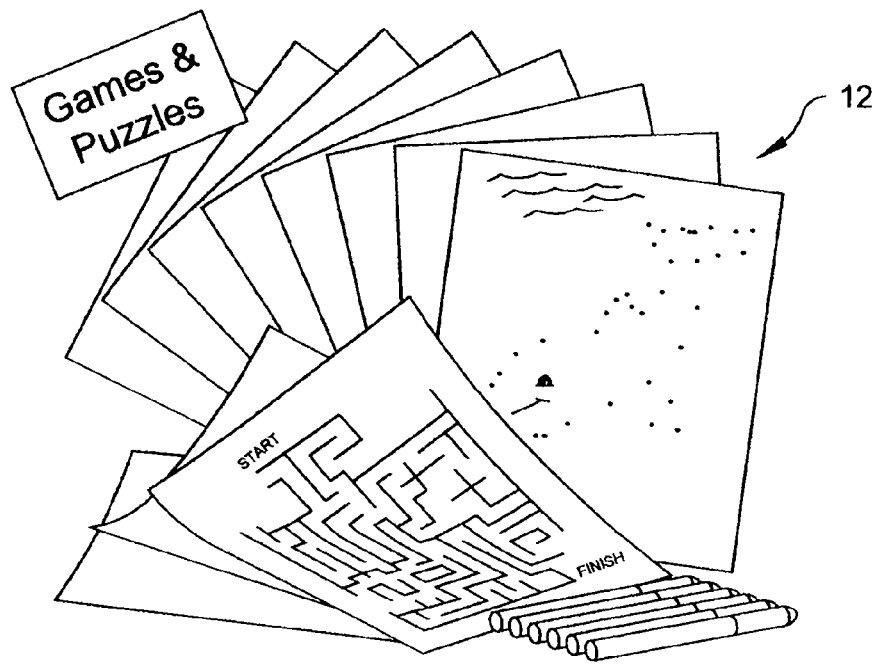
FIG. 21 is a preferred embodiment of the tangible medium directed to games and puzzles for use with the device of FIG. 1.
Figure 22:
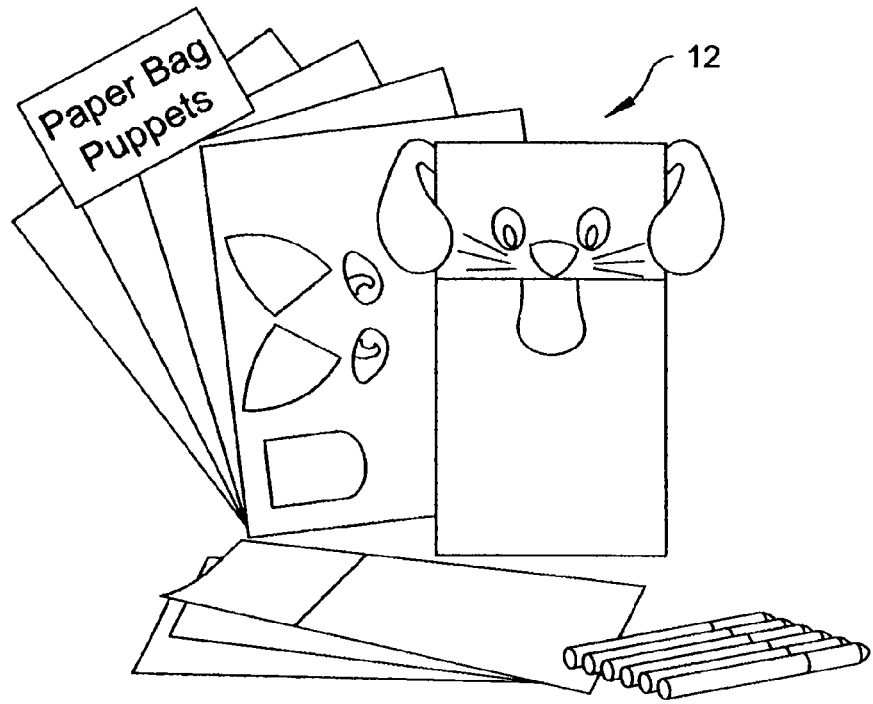
FIG. 22 is a preferred embodiment of the tangible medium directed to paper bag puppets for use with the device of FIG. 1.
Figure 23:
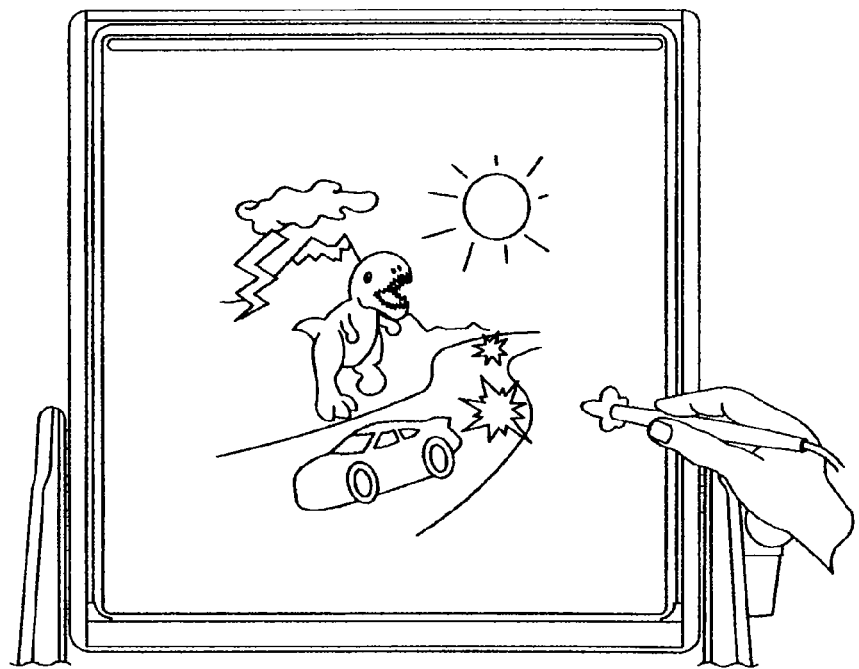
FIG. 23 is a front elevation view of magnetic elements of a preferred embodiment of a tangible medium attached to the platform of the device of FIG. 1.

The tangible medium 12 may have a wide variety of preferred embodiments. For example, the tangible medium 12 may be a consumable medium such as non-erasable composition or drawing paper. The tangible medium 12 may be a reusable medium such as an erasable paper or white board. The tangible medium 12 may comprise a template such as a medium with a background scene (FIG. 19) or a maze (FIG. 21). The tangible medium may comprise at least one selectable object such as a figure of a person (FIG. 17) or a figure of a dinosaur (FIG. 19). The tangible medium 12 may comprise a plurality of elements, each element having an element identification code, such as the parts of an animal (FIG. 20). At least two of the elements may be arrangeable to form a work of art, such as an elephant or giraffe (FIG. 20) or a paper bag puppet (FIG. 22). The elements may represent words and be arrangeable to form a sentence (FIGS. 17-18). The elements may be magnetic and may be attachable to a ferromagnetic surface (FIG. 23) such as the white board discussed above or a household appliance such as a refrigerator or oven door. The tangible medium 12 may a sheet having a plurality of separable elements, each element having an element identification code, such as the sheet of words (FIG. 17) or dinosaur parts (FIG. 19). The tangible medium 12 may be the page of a book (not shown) having selectable words or imaged thereon.

Figure 2:
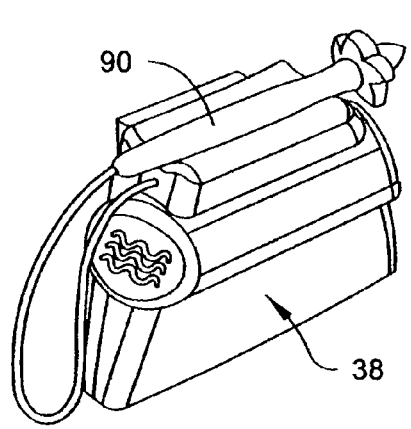
FIG. 2 is a front perspective view of the housing for the electronic device of FIG. 1.

Referring to FIGS. 2, 3, and 15, in another preferred embodiment of the user input device 20, a wand 90 may be provided and the input device 20 may be in the wand 90. Preferably, the wand 90 has a stylus-like shape and further and is configured to retractably contain one or more marking elements 88.

Figure 24:
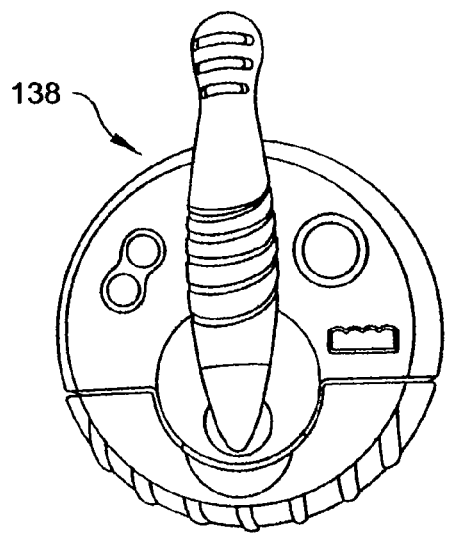
FIG. 24 is a top plan view of another preferred embodiment of the housing and input device for the device of FIG. 1.
Figure 25:
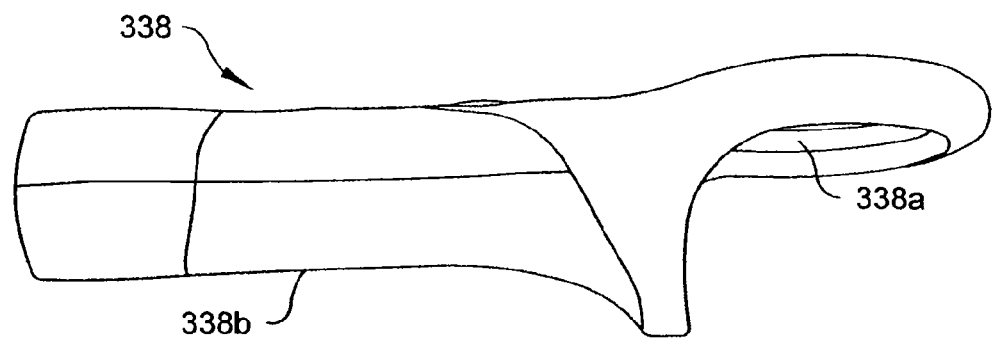
FIG. 25 is a is a side elevation view of another preferred embodiment of the housing and input device for the device of FIG. 1.
Figure 26:
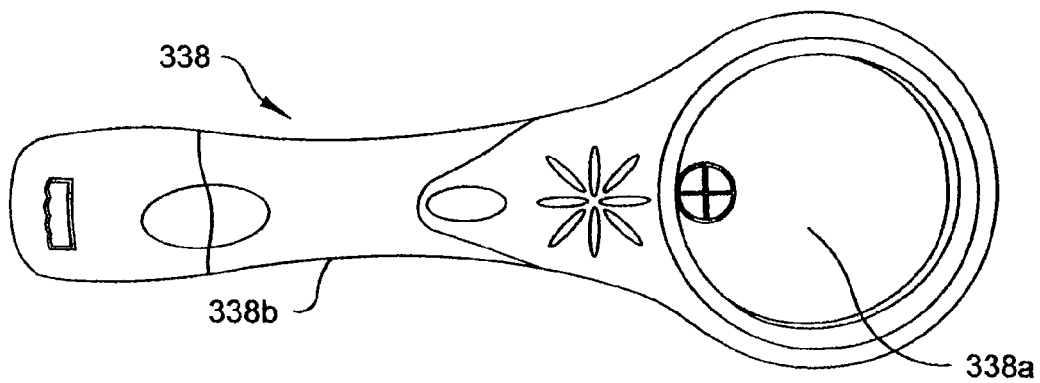
FIG. 26 is a top plan view of the preferred embodiment of FIG. 25.
Figure 27:
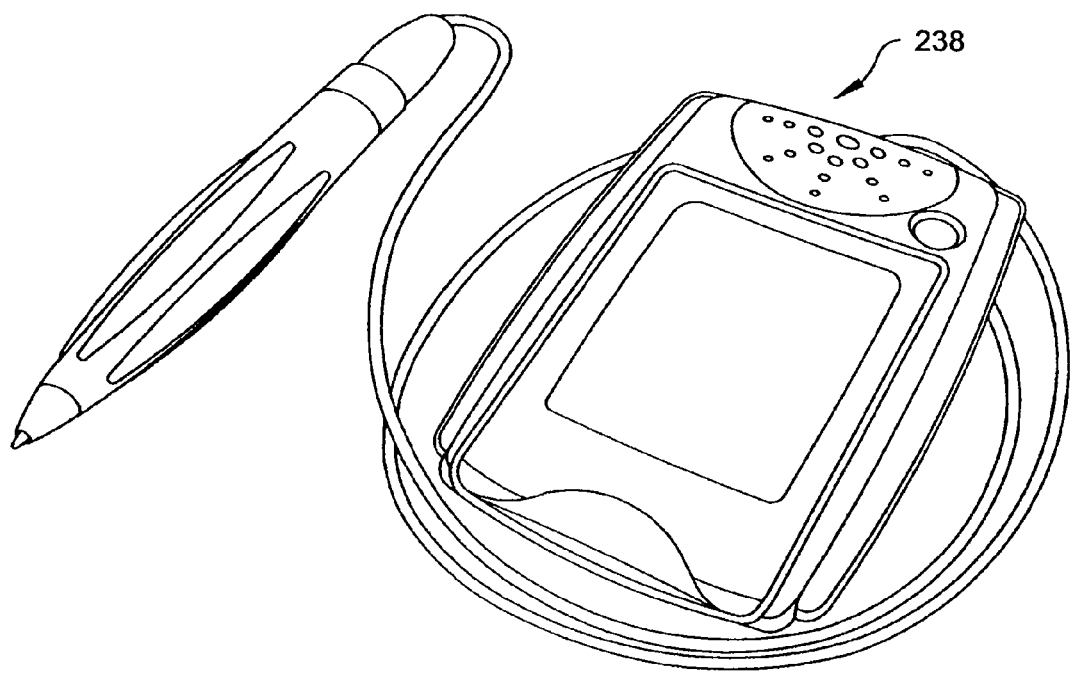
FIG. 27 is a top perspective view of another preferred embodiment of the housing and input device for the device of FIG. 1.

The housing 38 and the wand 90 may have a variety of form factors differing from the form factor of FIGS. 2-3. For example, in a preferred embodiment the housing 138 has a generally disk like shape (FIG. 24). Alternatively, in another preferred embodiment, the housing 238 has a generally rectangular shape (FIG. 27). Still further, referring to FIGS. 25-26, the housing 338 may have a generally spy-glass shape and have a viewer 338*a* and a generally cylindrical shaped grip 338*b* with an accessible enclosure (not shown). In this embodiment of the housing 338, the processor 16, the memory address space 18, the user input device 20, and the user output device 22 are in the housing 338, the memory interface 26 is in the enclosure.

Those skilled in the art will appreciate that changes could be made to the embodiments described above without departing from the broad inventive concept thereof. Therefore, the electronic device for enhancing an interactive experience with a tangible medium of expression is not limited to the particular embodiments disclosed, but it is intended to cover modifications within the spirit and scope of the present invention as defined by the appended claims.

All references, patent applications, and patents mentioned above are incorporated herein by reference in their entirety and are not to be construed as an admission that any of the of the cited documents constitutes prior art, or as an admission against interest in any manner.

We claim:

1. An electronic device for enhancing an interactive experience with a tangible medium of expression, the electronic device being operable with any of a plurality of preprogrammed, removable memory modules, at least one removable memory module having content relating to the tangible medium of expression, the electronic device comprising:
    a processor coupled to each of a memory address space having memory address space content, a user input device, and a user output device, the memory address space comprising a preprogrammed, non-removable electronic memory and;
    a memory interface coupled to the processor, the memory interface configured to increase the memory address space accessible to the processor when any combination of the removable memory modules is coupled to the memory interface,
    wherein the processor is configured to cause the user output device to produce an output signal relating to the tangible medium of expression based on the memory address space content when any combination of the plurality of removable memory modules including the at least one removable memory module is coupled to the memory interface.

2. The electronic device according to claim 1, wherein the memory interface has a plurality of memory module connectors, each configured and exposable sufficiently to removably receive any of the plurality of memory modules.

3. The electronic device according to claim 2, further comprising a housing having an accessible enclosure, the processor, the non-removable memory, the output device, and the memory interface in the housing, the plurality of memory module connectors in the accessible enclosure.

4. The electronic device according to claim 3, further comprising a platform, a coupling, and a base, the platform configured to support the tangible medium, the coupling configured to rotatably and slidably couple the platform to the base, the housing removably couplable to the base.

5. The electronic device according to claim 1, wherein the tangible medium has a surface with an identification code, the at least one removable memory has stored therein content relating to the identification code, the user input device comprises an identification code detector, the user output device comprises an audio signal generator, and the processor is configured to cause the audio signal generator to produce an audio signal relating to the tangible medium in response to detection of the identification code by the identification code detector.

6. The electronic device according to claim 5, wherein the identification code is a substantially invisible optically detectable code and the identification code detector is an electro-optic device configured to detect the substantially invisible optically detectable code.

7. The electronic device according to claim 6 in combination with the tangible medium, wherein the substantially invisible optically detectable code is an index based code.

8. The electronic device according to claim 7, wherein the index based code is frame based.

9. The electronic device according to claim 7, wherein the index based code is object based.

10. The electronic device according to claim 6 in combination with the tangible medium, wherein the substantially invisible optically detectable code is an location based code.

11. The electronic device according to claim 1 in combination with the tangible medium, wherein the tangible medium is consumable.

12. The electronic device according to claim 1 in combination with the tangible medium, wherein the tangible medium is reusable.

13. The electronic device according to claim 1 in combination with the tangible medium, wherein the tangible medium comprises a template.

14. The electronic device according to claim 13, wherein the template comprises a scene.

15. The electronic device according to claim 13, wherein the template comprises at least one selectable object having a selectable object identification code, the output device comprises an audio signal generator, and the processor is configured to cause the audio signal generator to produce an audio signal relating to the selectable object in response to detection of the selectable object identification code by the identification code detector.

16. The electronic device according to claim 1 in combination with the tangible medium, wherein the tangible medium comprises a plurality of elements, each element of the plurality of elements having an element identification code, the user output device comprises an audio signal generator, and the processor is configured to cause the audio signal generator to produce an audio signal relating to one element of the plurality of elements in response to detection of the element identification code of the one element by the identification code detector.

17. The electronic device according to claim 16, wherein each element is magnetic.

18. The electronic device according to claim 16, wherein at least two elements of the plurality of elements are arrangeable to comprise a work of art.

19. The electronic device according to claim 16, wherein each element of the plurality of elements represents a word and at least two elements of the plurality of elements are arrangeable to form a sentence.

20. The electronic device according to claim 1, in combination with the tangible medium, wherein the tangible medium comprises a sheet having a plurality of separable elements, each separable element having an element identification code, the user output device comprises an audio signal generator, and the processor is configured to cause the audio signal generator to produce an audio signal relating to one separable element of the plurality of separable elements in response to detection of the unique identification code of the one separable element by the identification code detector.

21. The electronic device according to claim 1, further comprising a housing having a viewer and a generally cylindrical shaped grip with an accessible enclosure, the processor, the memory address space, the user input device, and the user output device in the housing, the memory interface in the enclosure.

22. The electronic device according to claim 1, wherein the device further comprises a wand, and a housing having an accessible enclosure, the user input device in the wand, the processor, the memory address space, and the user output device in the housing, the memory interface in the enclosure.

23. The electronic device according to claim 22 wherein the wand has a generally stylus-like shape and further comprises a marking element.

24. The electronic device according to claim 1, wherein the device further comprises a housing having an accessible enclosure, a platform, a coupling, and a base, the processor, the memory address space, and the user output device in the housing, the memory interface in the enclosure, the housing removably couplable to the base, the coupling configured to rotatably and slidably couple the platform to the base.

25. The electronic device according to claim 24, wherein the coupling is configured to releasably retain the platform in a plurality of positions including a generally horizontal position, an angled position relative to a vertical, and the angled position at a plurality of vertical heights.

26. The device according to claim 24, wherein the platform has a tangible medium retainer configured to releasably retain the tangible medium adjacent the platform.

27. The electronic device according to claim 24, wherein the platform has a substantially flat planar surface configured to support the tangible medium.

28. The electronic device according to claim 27, wherein the substantially flat planar surface is ferromagnetic.

29. The device according to claim 28, wherein the substantially flat planar surface is reusable.

30. An interactive electronic device operable with any of a plurality of preprogrammed, removable read only memory modules to increase read only memory of the device, the interactive electronic device comprising:
  a processor operatively coupled to each of a memory address space comprising a preprogrammed non-removable read only memory, a user input device, and a user output device; and
  a memory interface coupled to the processor, the memory interface comprising:
    a plurality of memory module connectors, each configured and exposed sufficiently to removably receive any of the plurality of read only memory modules; and
    a bus configured to physically and electrically simultaneously couple all of the memory module connectors with the processor and to physically and electrically simultaneously couple the processor with any combination of the plurality of removable memory modules arranged in any order in any of the plurality of memory connectors so as to increase the memory address space accessible by the processor whereby all removable memory modules received in the memory module connectors are addressed simultaneously by the processor through the bus and the plurality of memory module connectors.

31. The interactive electronic device of claim 30, wherein the bus is configured to couple all of the memory module connectors directly with the processor and to couple the processor directly with any combination of the plurality of removable memory modules whereby all removable memory modules received in the memory module connectors are addressed directly by the processor through the bus and the plurality of memory module connectors.

32. The interactive electronic device of claim 30, wherein the device is for enhancing an interactive experience with a tangible medium of expression, at least one removable read only memory module of the plurality of preprogrammed, removable read only memory modules has content relating to the tangible medium of expression, and the processor is configured to cause the user output device to produce an output signal relating to the tangible medium of expression based on the content of the at least one removable read only memory module when any combination of the plurality of removable read only memory modules including the at least one removable read-only memory module is coupled to the memory interface.

* * * * *